United States Patent [19]

Cusdin et al.

[11] Patent Number: 5,414,383
[45] Date of Patent: May 9, 1995

[54] FOUR QUADRANT MULTIPLIER CIRCUIT AND A RECEIVER INCLUDING SUCH A CIRCUIT

[75] Inventors: Anthony R. Cusdin, Horley; Paul A. Moore, Seaford, both of England

[73] Assignee: U.S. Philips Corporation, New York, N.Y.

[21] Appl. No.: 202,139

[22] Filed: Feb. 24, 1994

[30] Foreign Application Priority Data

Apr. 8, 1993 [GB] United Kingdom ............... 9307384

[51] Int. Cl.6 ............................................. H03K 5/00
[52] U.S. Cl. .................................. 329/304; 329/306; 329/327; 327/357
[58] Field of Search ............. 329/304, 305, 306, 323, 329/327; 375/39, 80; 455/214, 323, 333, 337; 307/529; 328/160; 330/252

[56] References Cited

U.S. PATENT DOCUMENTS

| 3,241,078 | 3/1966 | Jones ........................ | 329/50 |
| 5,115,409 | 5/1992 | Stepp ........................ | 364/841 |
| 5,311,086 | 5/1994 | Yamaji et al. ............ | 307/498 |

FOREIGN PATENT DOCUMENTS 1530602 11/1978 United Kingdom .

OTHER PUBLICATIONS

Chadwick, "Low Power, Low Voltage Receiver Integrated Circuits", Institute of Electronic & Radio Engineers Publ. No. 78, Proc. of the 4th Intn'l Conf., Dec. 15–17, 1987, pp. 155–161.

Primary Examiner—Robert J. Pascal
Assistant Examiner—David H. Vu
Attorney, Agent, or Firm—Edward W. Goodman

[57] ABSTRACT

A four quadrant multiplier circuit having a high dynamic range and capable of operating at low voltages includes a dual transconductance amplifier circuit (TAC) consisting of NPN transistors (20 to 23 and 64 to 67), coupled to a first input port (36), first and second folded Darlington circuits (57,58), and a resistive element (78). Each Darlington circuit includes first and second NPN transistors (68,70 and 69,71) whose emitter-collector paths are connected in series and a third PNP transistor (72,73) having its emitter-collector path connected between the collector of the first transistor (68,69) and the base electrode of the second transistor (70,71). The emitter-collector junction (76,77) of the first and second transistors (68,70 and 69,71) is connected to the base electrode of the third transistor (72,73). The resistive element (78) is connected between the base electrodes of the third transistors (72,73). A second input port (56) is connected to the base electrodes of the first transistors (68,69). The emitter currents of the dual transconductance amplifier are supplied by way of current mirror circuits (80,81) from the emitter currents of the second transistors (70,71). The transconductance amplifier circuit (TAC) may be of any suitable type which has its transconductance linearly proportional to its emitter currents. In a refinement of the circuit, the current-to-voltage converter function of the current mirrors is carried out by the second transistors (70,71) and the transistors (82,83) of the current mirror circuits (80,81) are omitted.

10 Claims, 3 Drawing Sheets

FOUR QUADRANT MULTIPLIER CIRCUIT AND A RECEIVER INCLUDING SUCH A CIRCUIT

BACKGROUND OF THE INVENTION

1. Field of the Invention

The present invention relates to a four quadrant multiplier circuit which has particular, but not exclusive, application in demodulating FM signals in zero-IF receivers.

2. Description of the Related Art

The use of four quadrant multiplier circuits for demodutating FM signals is known, for example, from British Patent Specification 1 530 602 in which baseband I and Q signals are multiplied by the differentials of the Q and I signals, respectively. These multipliers need a high dynamic range because, unless the demodulator is preceded by an automatic gain control (agc) system with infinitely good regulation, their signal inputs will not be constant. Dynamic range in the present specification means the range of signal inputs over which adequate demodulator performance is obtained, given that statistical DC offset causes distortion at low signal input levels and limiting non-linearity causes distortion at high signal input levels. Noise is generally not a significant constraint at this late stage in a receiver. Basic four quadrant multiplier circuits are already known, for example, from U.S. Pat. No. 3,241,078. This citation discloses a circuit comprising a first long-tailed pair circuit for receiving a first pair of balanced voltage inputs and a second long-tailed pair circuit comprising a second pair of long-tailed pair circuits for processing signals at a second pair of balanced voltage inputs. There are two main drawbacks to this circuit. The dynamic range is barely sufficient for this application and the inputs are stacked one above the other across the supply. This stacking means that the inputs lie in two non-overlapping voltage ranges and makes it difficult to operate at low supply voltages.

Four quadrant multiplier circuits without stacking are already known, for example, from Chadwick, P. E. "Low power, low voltage receiver integrated circuits", Institution of Electronic and Radio Engineers Publication Number 78, Proceedings of the Fourth International Conference on Land Mobile Radio, University of Warwick, Coventry 15th–17th Dec. 1987, pages 155–161. The cited circuit uses PNP transistors in the first tailed pair circuit. Stacking is obviated in that the signal path between the first and the second pair of long-tailed pair circuits is by way of current mirror circuits but the problem of limited dynamic range remains. A drawback to this circuit is that the PNP transistors are a source of difficulty because lateral PNP transistors available in standard bipolar processes are slow and have a very low gain. Although the slowness can be tolerated in some applications, the very low gain lowers the input resistance of the input port for the second pair of balance inputs and makes it difficult to maintain consistent performance at large signal input levels. Processes are known for producing vertical PNP transistors but these add to the cost of the integrated circuit.

SUMMARY OF THE INVENTION

An object of the present invention is to provide a high dynamic range four quadrant multiplier circuit capable of operating at low supply voltages but without the limitations caused by the use of PNP transistors.

According to one aspect of the present invention, there is provided a four quadrant multiplier circuit comprising first and second input ports and first and second circuits coupled, respectively, to the first and second input ports, said second circuit converting voltages applied at the second input port to currents which are supplied to the first circuit, characterized in that the first circuit comprises a dual transconductance amplifier whose transconductance is linearly proportional to currents supplied by the second circuit, the dual transconductance amplifier comprising transistors of a first conductivity type, and in that the second circuit comprises first and second folded Darlington circuits, each folded Darlington circuit comprising first and second transistors of a first conductivity type whose emitter-collector paths are connected in series and a third transistor of a second conductivity type having its emitter collector path connected between the collector of the first transistor and the base of the second transistor, the junction of the emitter of the first transistor and the collector of the second transistor being connected to the base electrode of the third transistor, the second input port being connected to the base electrodes of the first transistors, and a resistive element connected between the base electrodes of the third transistors, wherein the currents supplied to the dual transconductance amplifier are derived by way of respective current mirror circuits from the emitter currents of the respective second transistors.

The present invention is based on the realization that when the first and second transistors are NPN transistors and the third transistor is a PNP transistor, the PNP transistor in a folded Darlington operates in a common base mode and only carries the base current of the second NPN transistor and therefore the difficulty of using a lateral PNP transistor can be minimized. All transistors operate faster in common base mode than in common emitter mode and the gain of lateral PNP transistors is best at low currents.

If desired, the current-to-voltage converters of the current mirror circuits may comprise the second NPN transistor. Using the second transistor of each of the folded Darlington circuits as part of an associated current mirror circuit is based on the realization that the current flowing through this transistor will be the same as that flowing through the transistor(s) of the current mirror circuit. The omission of this transistor saves one base-emitter voltage which enables the circuit to work at very low voltages and allows both the nominal DC bias point and the point of limiting of the two signal input ports to be made equal.

The combination of an upper dual transconductance amplifier and a lower pair of folded Darlington circuits with an emitter degeneration resistor has been found to give a linear high dynamic range four quadrant multiplier circuit which can be operated at very low voltages typically found in battery operated equipments. The inputs to the upper and lower circuits are in the same voltage range, that is their top and bottom limits can be designed to be at the same voltages, respectively.

According to a second aspect of the present invention, there is provided a FM receiver having a signal input, means for producing quadrature related zero IF signals and demodulating means for producing an output signal, the demodulating means comprising at least one four quadrant multiplier circuit comprising first and second input ports and first and second circuits coupled, respectively, to the first and second input ports, said second circuit converting voltages applied to the second input port to currents which are supplied to the first circuit, characterized in that the first circuit comprises a dual transconductance amplifier whose transconductance is linearly proportional to currents supplied by the second circuit, the dual transconductance amplifier comprising transistors of a first conductivity type, and in that the second circuit comprises first and second folded Darlington circuits, each folded Darlington circuit comprising first and second transistors of a first conductivity type whose emitter-collector paths are connected in series, and a third transistor of a second conductivity type having its emitter-collector path connected between the collector of the first transistor and the base of the second transistor, the junction of the emitter of the first transistor and the collector of the second transistor being connected to the base electrode of the third transistor, the second input port being connected to the base electrodes of the first transistors, and a resistive element connected between the base electrodes of the third transistors, wherein the currents supplied to the dual transconductance amplifier are derived by way of respective current mirror circuits from the respective second transistors.

BRIEF DESCRIPTION OF THE DRAWINGS

The present invention will now be described, by way of example, with reference to the accompanying drawings, wherein.

In the drawings the same reference numerals have been used to indicate corresponding features.

DESCRIPTION OF THE PREFERRED EMBODIMENTS

Figure 1:
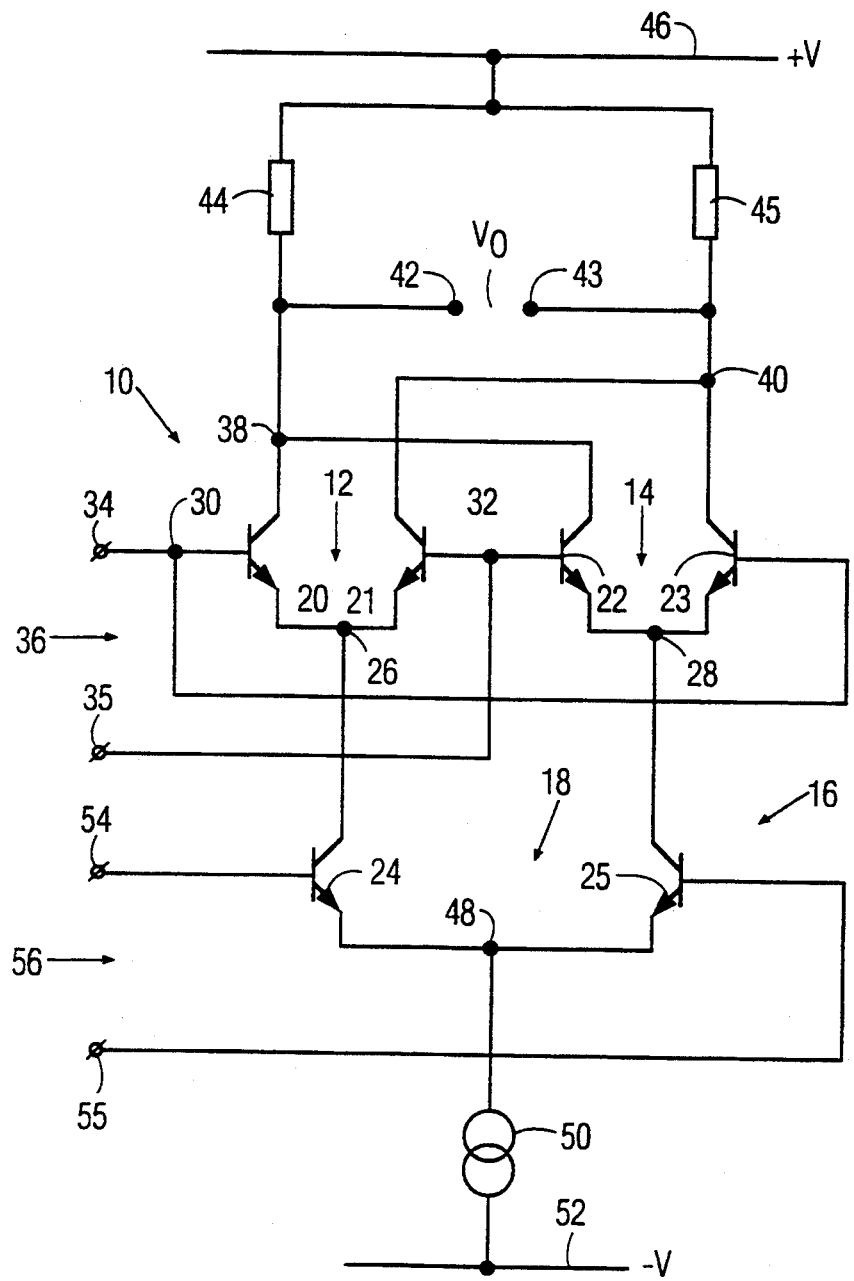
FIG. 1 is a schematic diagram of a known four quadrant multiplier circuit.

Referring to FIG. 1, the illustrated four quadrant multiplier circuit was first proposed by Jones, H. E. in U.S. Pat. No. 3,241,078 entitled "Dual output synchronous detector utilizing transistorized differential amplifiers". The circuit comprises a transistor tree circuit comprising an upper circuit 10 constituted by a pair of differential amplifiers 12,14 and a lower circuit 16 constituted by another differential amplifier 18.

Each of the differential amplifiers 12,14 and 18 comprise first and second NPN transistors 20,21; 22,23 and 24,25, respectively. The emitter electrodes of the transistors 20,21 and of the transistors 22,23 are connected together and common junctions 26,28, are connected, respectively, to the collector electrodes of the transistors 24,25. The base electrodes of the transistors 20,23 are interconnected at a junction 30 as are the base electrodes of the transistors 21,22 at a junction 32. Input terminals 34,35 of an upper input port 36 are connected to the junctions 30,32, respectively. The collector electrodes of the transistors 20,22 and of the transistors 21,23 are interconnected at respective junctions 38,40.

Output terminals 42,43 together with one terminal of load resistors 44,45 are connected to the junctions 38,40. The other terminals of the load resistors 44,45 are connected to the positive supply line 46.

The emitter electrodes of the transistors 24,25 are connected to a junction 48 which is connected to one side of a constant current source 50, the other side of which is connected to a negative supply line 52. Input terminals 54,55 of a lower input port 56 are connected, respectively, to the base electrodes of the transistors 24,25.

Although this known circuit establishes the basic operating principles underlying a four quadrant multiplier circuit, it has a number of disadvantages. Among these are the intrinsically limited dynamic range of the differential amplifiers. Also since the emitter voltages at the junctions 26,28 are the collector voltages of the transistors 24,25, respectively, the difference between these voltages must be such as to enable the upper and lower circuits 10,16 to operate properly. This means that the signals applied to the upper and lower input ports must lie in two non-overlapping voltage ranges and makes it difficult to operate at low supply voltages.

Figure 2:
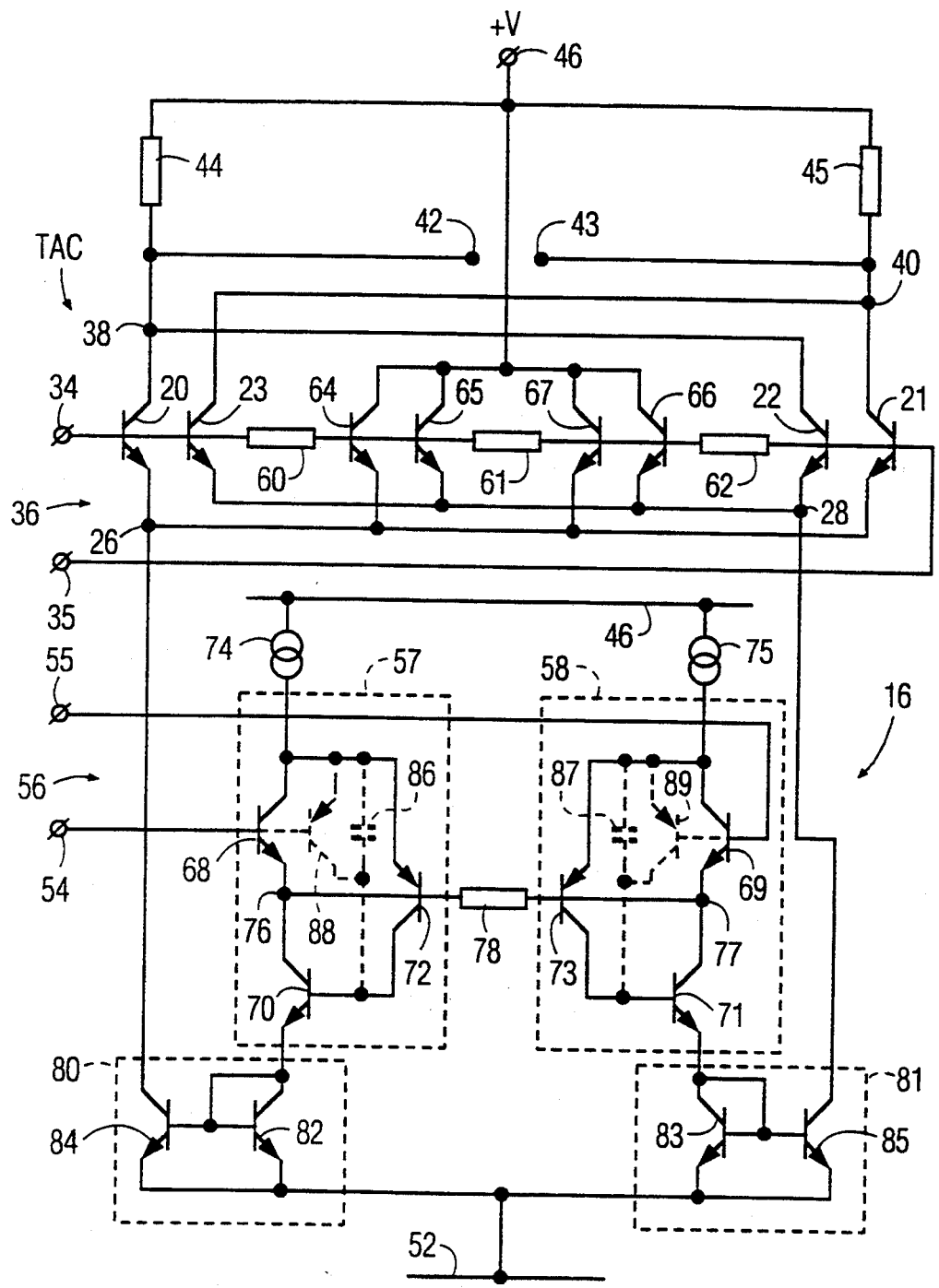
FIG. 2 is a schematic diagram of an embodiment of a four quadrant multiplier circuit made in accordance with the present invention.

Referring to FIG. 2, the illustrated four quadrant multiplier circuit comprises an upper dual class-AB transconductance amplifier circuit TAG and a lower circuit 16 formed by two folded Darlington circuits 57,58, and an emitter degeneration resistor 78. The dual transconductance amplifier circuit TAG comprises NPN transistors. Signal inputs 34,35 are connected to the base electrodes of transistors 20,23 and 21,22, respectively. The emitter electrodes of the transistors 20,21 are connected to a junction 26 and those of the transistors 22,23 are connected to a junction 28. The collector electrodes of the transistors 20,22 and 21,23 are connected, respectively, to junctions 38,40 which are connected to output terminals 42,43 and to load resistors 44,45 which are connected to a positive supply rail 46. Load resistors 44,45 may be omitted in which case the output may be taken as the difference in the currents drawn at the output terminals 42,43. A tapped impedance comprising series connected resistive segments 60,61 and 62 is coupled between the base electrodes of the transistors 20,23 and 21,22. Base electrodes of NPN transistors 64,65 and 66,67 are respectively connected to the junctions of the segments 60,61 and 61,62. The tapping points and the relative sizes of NPN transistors 64 to 67 with respect to NPN transistors 20 to 23 are chosen in known manner to obtain linear transconductor characteristics. The collector electrodes of the transistors 64,65,66 and 67 are connected to the supply rail 46. The emitter electrodes of the transistors 64,67 are connected to the junction 26, and the emitter electrodes of the transistors 65,66 are connected to the junction 28. The transconductance of the dual transconductance amplifier circuit is linearly proportional to the currents supplied at the junctions 26,28.

Signal inputs 54,55 are connected to respective folded Darlington circuits 57,58. Each circuit 57,58 comprises first and second NPN transistors 68,70 and 69,71, respectively, and a lateral PNP transistor 72 and 73, respectively. The signal inputs 54,55 are connected to base electrodes of the first transistors 68,69, respectively. The collector-emitter paths of the first and second NPN transistors 68,70 and 69,71 are connected in series and the collector-emitter paths of the PNP transistors 72,73 are connected between the base electrodes of the second transistors 70,71 and the collector electrodes of the first transistors 68,69, respectively, which collector electrodes are connected to current sources 74,75, respectively, which are also connected to the positive supply rail 46. The base electrodes of the PNP transistors 72,73 are respectively connected to the junctions 76,77 of the emitters of the first transistors 68,70 and the collectors of the second transistors 69,71. The emitter degeneration resistor 78 is connected between the base electrodes of the PNP transistors 72,73.

The current in the respective folded Darlington circuits 57,58 is mirrored to the junctions 26,28 of the dual transconductance amplifier circuit TAC by respective current mirror circuits 80,81. Each current mirror circuit comprises NPN transistors 82,84 and 83,85. The transistors 82,83 have their collector-emitter paths connected to the emitter electrodes of the transistors 70,71, respectively, and constitute current-to-voltage converters. The transistors 84,85 constitute voltage-to-current converters. The collector electrodes of the transistors 84,85 are connected to the junctions 26,28, respectively. The emitter electrodes of these transistors 84,85 together with those of the transistors 82,83 are connected to the negative voltage line 52. The base electrodes of the transistors 84,85 are connected to the base electrodes of the transistors 82,83, respectively. A feature of the circuit shown in FIG. 2 is that the upper and lower input voltages can be in the same range which enables the circuit to be designed to operate over a much higher dynamic range compared to the circuit shown in FIG. 1. The nominal dc bias points of the upper and lower inputs still need to be set to different values for maximum dynamic range.

Optionally, each of the folded Darlington circuits may include a capacitor 86,87 to provide stability at high frequencies, each of the capacitors being connected in parallel with the emitter-collector paths of the PNP transistors 72,73. Anti-latch-up lateral PNP transistors 88,89 may also be provided. The base and emitter electrodes of the transistors 30 88,89 are connected to the base and collector electrodes of the NPN transistors 68,69, respectively, and the collector electrodes of the transistors 88,89, are connected to the base electrodes of the NPN transistors 70,71, respectively.

Figure 3:
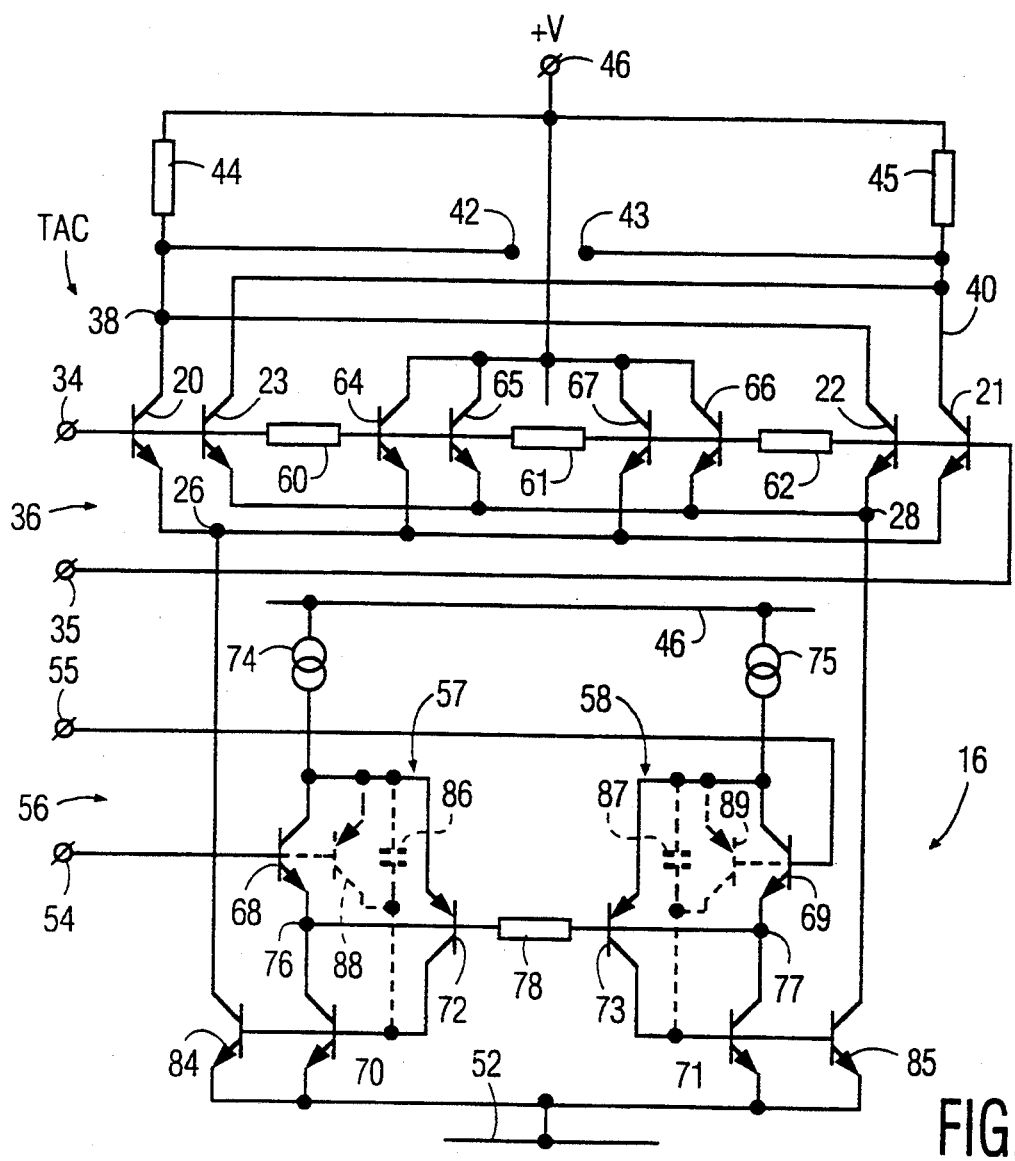
FIG. 3 is a schematic diagram of another embodiment of a four quadrant multiplier circuit made in accordance with the present invention.

The embodiment of the invention shown in FIG. 3 is, apart from one difference, identical with the circuit shown in FIG. 2 and in the interests of brevity a detailed description will not be given.

Compared to the embodiment shown in FIG. 2, the difference is that the current-to-voltage converting transistors 82,83 of the current mirror circuits 80,81 have been omitted and the transistors 70,71 act as current-to-voltage converters. The elimination of separate current-to-voltage converter transistors is possible because the currents which would have been flowing in the transistors 82,83 are equal to the currents flowing in the second NPN transistors 70,71 of the folded Darlington circuits. The elimination of these transistors saves one base-emitter voltage which enables the circuit shown in FIG. 3 to work at lower voltages and allows both the nominal dc bias point and the point of limiting of the signal input ports 36,56 to be made equal. The circuit shown in FIG. 3 is similarly able to operate over a higher dynamic range compared to the known circuit shown in FIG. 1.

Figure 4:
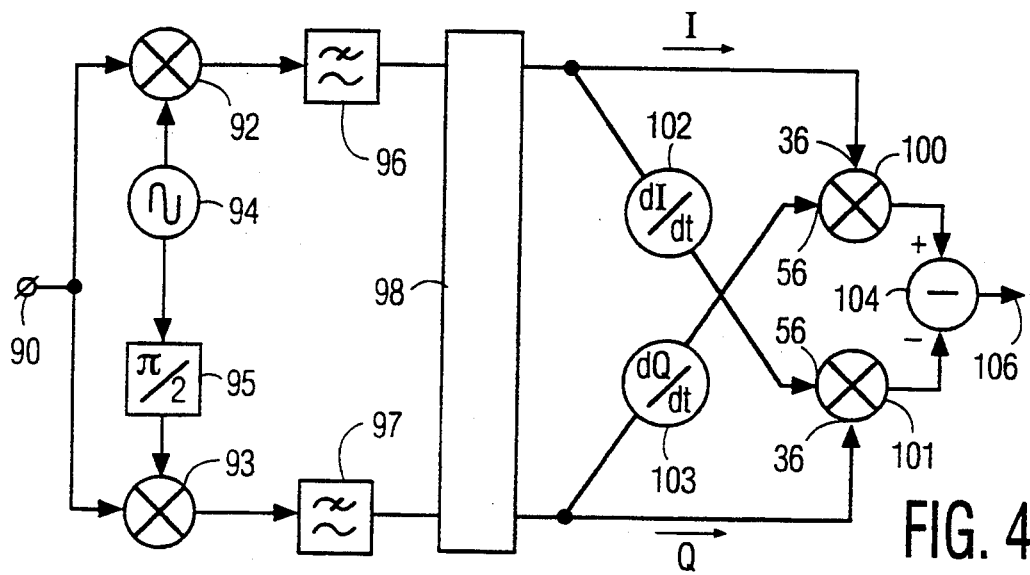
FIG. 4 is a block schematic diagram of a FM receiver including two four quadrant multiplier circuits made in accordance with the present invention.

FIG. 4 illustrates a zero IF FM receiver comprising a signal input 90 connected to first inputs of first and second mixers 92,93. A local oscillator 94 is connected to a second input of the mixer 92 and by way of a ninety degree phase shifter 95 to a second input of the mixer 93.

Low-pass filters 96,97 select the quadrature related frequency difference zero IF signals I and Q from the products of B mixing at the outputs of the mixers 92,93. Outputs of the filters 96,97 are connected to a module 98 which comprises either an AGC circuit or other means to reduce the dynamic range of the signal voltages from the filters. Two four quadrant multiplier circuits 100,101 of a type described with reference to FIG. 2 or FIG. 3 are connected to the module 98. The I and Q signals are supplied, respectively, to for example the first input port 36 of each multiplier circuit 100,101. Also the I and Q signals are differentiated with respect to time in differentiator circuits 102,103 and supplied to the other input ports 56 of the multiplier circuits 100,101. The outputs of the multiplier circuits 100,101 are connected to a subtractor circuit 104 which provides the demodulated signal on its output 106. Where the outputs of the multiplier circuits 100,101 are taken as currents the subtraction can be implemented by simply connecting their outputs together in the appropriate polarity.

Although a dual class-AB transconductor amplifier circuit has been disclosed in both the illustrated embodiments of the present invention, any suitable dual transconductor amplifier circuit may be used instead, for example a dual class-A transconductance amplifier circuit derived from the illustrated circuit by rearranging the connections of the collectors of the transistors 20 to 23 and 64 to 67, or known high dynamic range transconductors which are characterized that their transconductance is linearly proportional to the values of a number of currents fed in at a plurality of points equivalent to the junctions 26,28 and derived, for example, from suitably scaled multiple voltage-to-current converters equivalent to the transistors 84,85 in the current mirror circuits 80,81 (FIG. 2).

From reading the present disclosure, other modifications 20 will be apparent to persons skilled in the art. Such modifications may involve other features which are already known in the design, manufacture and use of four quadrant multiplier circuits and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

We claim:

1. A four quadrant multiplier circuit comprising first and second input ports and first and second circuits coupled respectively to the first and second input ports, said second circuit converting voltages applied at the second input port to currents which are supplied to the first circuit, characterized in that the first circuit comprises a dual transconductance amplifier whose transconductance is linearly proportional to currents supplied by the second circuit, the dual transconductance amplifier comprising transistors of a first conductivity type, and in that the second circuit comprises first and second folded Darlington circuits, each folded Darlington circuit comprising first and second transistors of a first conductivity type whose emitter-collector paths are connected in series, and a third transistor of a second conductivity type having its emitter collector path connected between the collector of the first transistor and the base of the second transistor, the junction of the emitter of the first transistor and the collector of the second transistor being connected to the base electrode of the third transistor, the second input port being connected to the base electrodes of the first transistors, and a resistive element connected between the base electrodes of the third transistors, wherein the currents supplied to the dual transconductance amplifier are derived by way of respective current mirror circuits from the emitter currents of the respective second transistors.

2. A multiplier circuit as claimed in claim 1, characterized in that the current-to-voltage converters of the current mirror circuits comprise the second transistors.

3. A multiplier circuit as claimed in claim 1, characterized in that a capacitive element is connected between the emitter and collector electrodes of each third transistor.

4. A multiplier circuit as claimed in claim 1, characterized by each of the first and second Darlington circuits having a fourth transistor of the second conductivity type, the emitter and base electrodes of the fourth transistors being connected, respectively, to the collector and base electrodes of the first transistor and the collector electrode of the fourth transistor being connected to the base electrode of the second transistor.

5. A multiplier circuit as claimed in claim 1, characterized in that the dual transconductance amplifier comprises a dual class-AB transconductance amplifier.

6. A multiplier circuit as claimed in claim 1, characterized in that the dual transconductance amplifier comprises fifth and sixth transistors having collector electrodes connected to respective resistive elements, base electrodes connected to the first input port and emitter electrodes connected to a first junction which is connected to one of the current mirror circuits, seventh and eighth transistors having base electrodes respectively connected to the base electrodes of the fifth and sixth transistors, emitter electrodes connected to a second junction which is connected to the other of the current mirror circuits, collector electrodes of the seventh and eighth transistors being connected to the collector electrode of the sixth and fifth transistors, respectively, a tapped resistive element having first and second ends connected respectively to the base electrodes of the fifth and seventh transistors and of the sixth and eighth transistors, each tap of the resistive element comprising base electrodes of pairs of transistors, collector electrodes of the transistors of each pair being coupled to a supply voltage line, an emitter electrode of one transistor of each pair being connected to the first junction and an emitter electrode of the other transistor of each pair being connected to the second junction.

7. A FM receiver having a signal input, means for producing quadrature related zero IF signals and demodulating means for producing an output signal, the demodulating means comprising at least one four quadrant multiplier circuit comprising first and second input ports and first and second circuits coupled, respectively, to the first and second input ports, said second circuit converting voltages applied to the second input port to currents which are supplied to the first circuit, characterized in that the first circuit comprises a dual transconductance amplifier whose transconductance is linearly proportional to currents supplied by the second circuit, the dual transconductance amplifier comprising transistors of a first conductivity type, and in that the second circuit comprises first and second folded Darlington circuits, each folded Darlington circuit comprising first and second transistors of a first conductivity type whose emitter-collector paths are connected in series, and a third transistor of a second conductivity type having its emitter-collector path connected between the collector of the first transistor and the base of the second transistor, the junction of the emitter of the first transistor and the collector of the second transistor being connected to the base electrode of the third transistor, the second input port being connected to the base electrodes of the first transistors, and a resistive element connected between the base electrodes of the third transistors, wherein the currents supplied to the dual transconductance amplifier are derived by way of respective current mirror circuits from the respective second transistors.

8. A receiver as claimed in claim 7, characterized in that the current-to-voltage converters of the current mirror circuits comprise the second transistors.

9. A receiver as claimed in claim 7, characterized in that a capacitive element is connected between the emitter and collector electrodes of each third transistor.

10. A receiver as claimed in claim 7, characterized by each of the first and second Darlington circuits comprising a fourth transistor of the second conductivity type, the emitter and base electrodes of the fourth transistors being connected, respectively, to the collector and base electrodes of the first transistor and the collector electrode of the fourth transistor being connected to the base electrode of the second transistor.

* * * * *